July 31, 1962 T. H. BONN ET AL 3,047,231

ELECTRICAL SWITCHING CIRCUITS

Filed Oct. 14, 1958 4 Sheets-Sheet 1

INVENTORS.
THEODORE H. BONN
NOAH S. PRYWES

BY [signature]
ATTORNEY

INVENTORS.
THEODORE H. BONN
NOAH S. PRYWES
BY [signature]
ATTORNEY

July 31, 1962 T. H. BONN ET AL 3,047,231

ELECTRICAL SWITCHING CIRCUITS

Filed Oct. 14, 1958 4 Sheets-Sheet 3

INVENTORS.
THEODORE H. BONN
NOAH S. PRYWES

BY [signature]
ATTORNEY

ELECTRICAL SWITCHING CIRCUITS

INVENTORS.
THEODORE H. BONN
NOAH S. PRYWES
BY [signature]
ATTORNEY

United States Patent Office 3,047,231
Patented July 31, 1962

3,047,231
ELECTRICAL SWITCHING CIRCUITS
Theodore H. Bonn, Merion Station, and Noah S. Prywes, Bala-Cynwyd, Pa., assignors to Sperry Rand Corporation, New York, N.Y., a corporation of Delaware
Filed Oct. 14, 1958, Ser. No. 767,112
26 Claims. (Cl. 235—176)

This invention relates to electrical circuits, and more particularly to such circuits for carrying out logic or switching operations.

Various electrical circuits have been proposed and developed which utilize solid state elements and which may be used to carry out the logic or switching functions required in digital information handling systems such as digital computers. Among the solid state elements that have been utilized are magnetic elements, crystal diodes, and transistors.

In modern digital computers, two types of logic circuitry are employed: One is the "relay" or "contact" type, which may take the form of a "relay tree" or pyramid circuit, and examples of which are described in the article "Pulse-Switching Circuits Using Magnetic Cores" in Proc. I.R.E., May 1955, pp. 5 to 84. Another type is the "single level" type, in which electrical signals are combined or mixed as in, for example, diode logic circuits. The single-level type of logic circuitry has often been preferred due to simplicity, uniformity, and high speed as compared to relay-type circuits.

It is among the objects of this invention to provide:

A new and improved electrical circuit of the relay type;

A new and improved electrical circuit using solid state elements;

A new and improved relay-logic circuit using solid state elements;

A new and improved electrical circuit using solid state elements that may be operated at high speeds;

A new and improved electrical circuit of the relay type having high speed operation;

A new and improved relay-logic circuit using solid state elements and having high speed operation.

In accordance with this invention an electrical circuit includes a plurality of transformers. Separate input circuits are connected to the primaries of these transformers. Secondaries of different combinations of the transformers are connected in parallel and series combinations with unidirectional elements to different output circuits. The arrangement is such that the output circuits receive signals in accordance with the associated combination of voltages induced in the secondaries by the corresponding inputs.

The foregoing and other objects, the advantages and novel features of this invention, as well as the invention itself, both as to its organization and mode of operation, may be best understood from the following description when read in connection with the accompanying drawing, in which like reference numerals refer to like parts, and in which.

Figure 1:
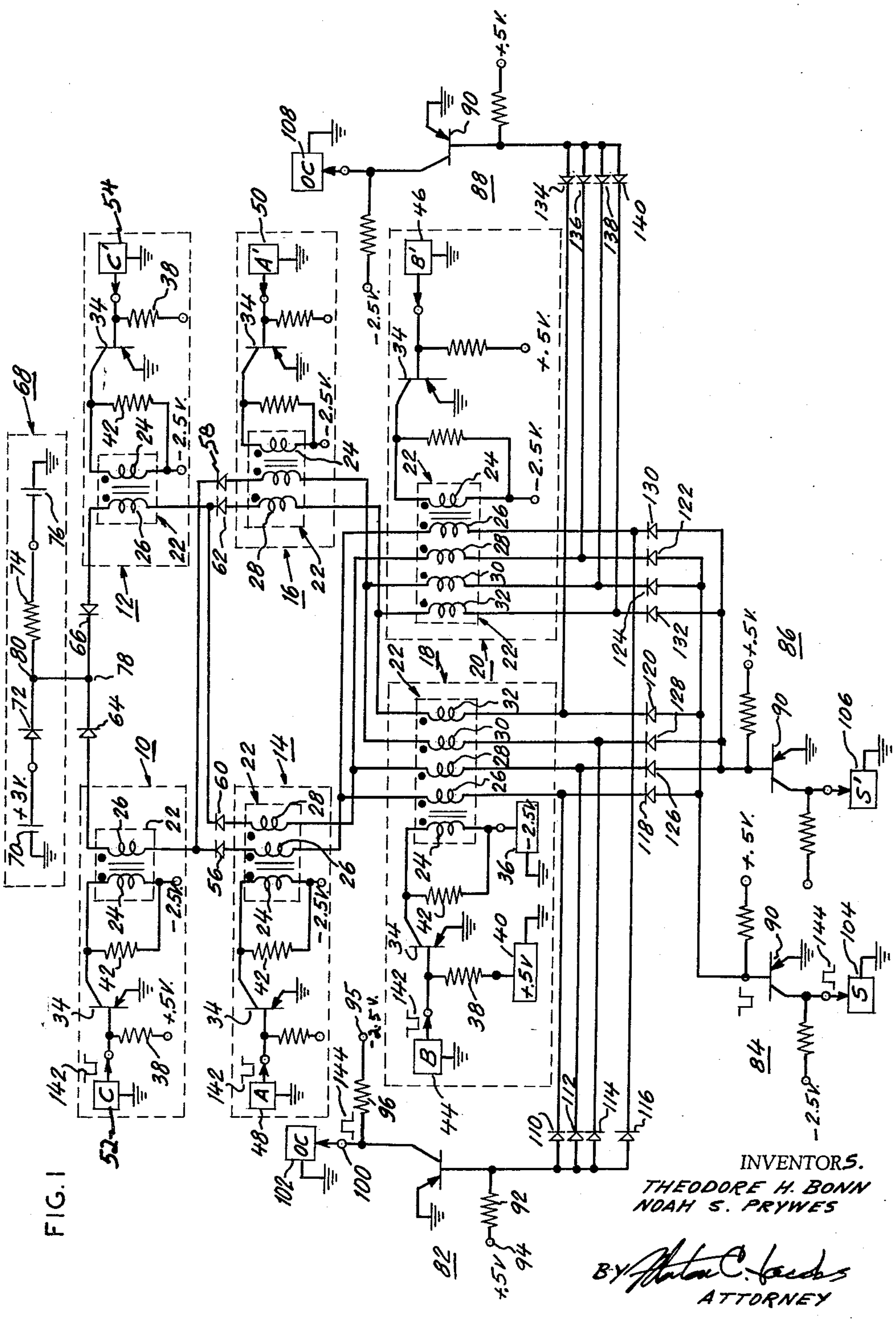
FIGURE 1 is a schematic circuit diagram of an electrical circuit embodying this invention.

In FIGURE 1; a plurality of similar electrical stages 10, 12, 14, 16, 18, 20 are shown interconnected in a circuit which is similar to one which is sometimes called a relay tree or pyramid switching circuit. Each of the stages 10 to 20 may be analogized to a multicontact relay of such a relay tree. Each of the stages 10 to 20 is substantially identical, except for certain differences noted hereinafter, and, therefore, the description of one, 18, of them in detail may be considered as applicable to the others.

Figure 2:
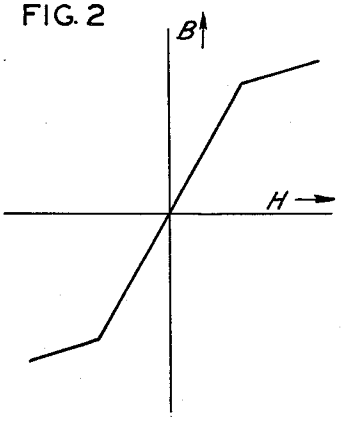
FIGURE 2 is an idealized graph of the hysteresis characteristic of magnetic elements employed in the circuit of FIGURE 1.

In the stage 18, a transformer 22 has a primary winding 24 and four secondary windings 26, 28, 30, and 32. The core of the transformer 22 is of a material having substantially no remanence, and having a hysteresis characteristic of the type, for example, shown in idealized form in FIGURE 2. The relative senses of linkage of the transformer windings are shown by the usual "dot" convention. An input circuit in the form of a transistor 34, for example, of the junction type, has its collector connected to one terminal of the primary 24, the other terminal of which is connected to the negative pole of a direct voltage source 36. Connected across the primary 24 is a resistor 42. The emitter of the transistor 34 is connected to a common return circuit or to a reference potential terminal shown by the conventional ground symbol. The base of the transistor is connected through a resistor 38 to the positive pole of a direct voltage source 40 which serves to bias the transistor in the back direction. Input signals supplied to the base from a source 44 may be binary signals of the form of pulse and the absence of a pulse representing, for example, the binary digits "1" and "0," respectively. These input signals may be derived from any of various forms of digital information handling devices.

The stage 20 is identical to stage 18 (corresponding parts being referenced by the same numerals), except that the input signals to the stage 20 are derived from a source 46 which supplies signals that are the complement of the signals supplied by the source 44. This complementary relationship of the signals supplied by the sources 44 and 46 is represented by these sources being identified by the letters B, and B′, respectively in the usual convention.

The stages 14 and 16 are also the same as stage 18 except that the third and fourth windings 30 and 32 have been omitted in FIGURE 1, because these windings are not utilized in the particular logic operation carried out by that circuit. The sources 48 and 50 of the stages 14 and 16, respectively, have a complementary signal relationship in the manner described above. Similarly, the stages 10 and 12 are identical to the stage 18 except that only a single secondary winding 26 is shown in each of these stages, the others of the secondary windings being omitted from the stages 10 and 12 because they are not utilized. The sources 52 and 54 likewise supply complementary input signals.

The stages 10–20 are connected in different levels of a circuit resembling a relay tree. The stages 10 and 12 are connected in the first level, the stages 14 and 16 in the second level, and the stages 18 and 20 in the third level. The lower terminal of the secondary winding 26 of the stage 10 is connected to the upper terminals of the first secondary windings 26, 26 of the stages 14 and 16 via unidirectional elements 56, 58, respectively, shown as semiconductor diodes. Similarly, the lower terminal of the secondary winding 26 of the stage 12 is connected to the upper terminals of the second secondary windings 28, 28 of the stages 14 and 16, respectively by way of the diodes 60 and 62. In a similar fashion, the lower terminal of the first secondary windings 26, of the stage 14 is connected to the upper terminals of the windings 26, 26 of the stages 18 and 20; and the lower terminal of the second secondary winding 28 of the stage 14 is connected to the upper terminals of the second secondary windings 28, 28 of the stages 18 and 20. The lower terminal of the first secondary winding 26 of the stage 16 is connected to the upper terminals of the third secondary windings 30, 30 of the stages 18 and 20; and the lower terminal of the second secondary 28 of the stage 16 is connected to the upper terminals of the fourth secondary windings 32, 32 of the stages 18 and 20, respectively.

The upper terminals of the secondaries 26 of the stages 10 and 12 are connected through separate diodes 64 and 66 respectively to a circuit 68 that is sometimes called a current limiter. The current limiter 68 includes a direct voltage source 70 connected at its positive pole to the anode of a diode 72, the cathode of which is connected to a terminal of resistor 74. The other terminal of the resistor 74 is connected to the negative pole of a direct voltage source 76. The other poles of the sources 70 and 76 are returned to ground. The junction 78 of the diodes 64 and 66 is connected to the junction 80 of the diode 72 and resistor 74.

Four output circuits 82, 84, 86, and 88 are shown connected to the secondary windings of the stages 18 and 20 in different combinations in accordance with the logic to be carried out by the circuit. The stage 82 includes a transistor 90, which may be of the junction type, connected in the common-emitter mode. Connected to the base of the emitter 90 is a resistor 92 and a positive pole 94 of a voltage source, the negative pole of which is returned to ground. The collector of the transistor 90 is connected through a resistor 96 to the negative pole 95 of an operating potential source the positive pole of which is connected to the common return. An output terminal 100 is connected to the collector of the transistor 90, and a load circuit 102 is connected to the output terminal 100.

The output circuits 84, 86, and 88 are identical to the circuit 82 (corresponding parts are referenced by the same numerals), except for having different load circuits 104, 106, and 108 respectively. The output circuits 82 to 88 also differ in the inputs that are applied to their respective transistor bases. The output circuit 82 is connected to the lower terminals of the first, second, and third secondaries 26, 28, and 30 of the stage 18 and of the first secondary 26 of the stage 20 via separate buffer diodes 110, 112, 114, 116, respectively. In a similar fashion, the base of the transistor 90 of the output circuit 84 is connected to the lower terminals of the first secondary 26 and fourth secondary 32 of the stage 18 and of the second and third secondaries 28, 30 of the stage 20 via separate buffer diodes 118, 120, 122, and 124, respectively. The transistor base of the output circuit 86 receives signals from the secondaries 28 and 30 of the stage 18 and secondaries 26 and 32 of the stage 20 via diodes 126, 128, 130, and 132, respectively. The transistor base of the stage 88 is connected to the fourth secondary 32 of the stage 18 and to the second, third, fourth secondaries of the stage 20 via the diodes 134, 136, 138, and 140, respectively.

As discussed hereinafter, the output circuits 82 to 88 may be the input circuits of other similar relay trees, in which the load circuits 102–108 would be transformers similar to the transformers 22.

The circuit of FIGURE 1 is arranged, by way of illustration, to carry out the logic associated with a binary adder. For this reason, three levels of the relay tree are shown. The first level is associated with the input carry C, the second level associated with the augend A, and the third level associated with the addend B. For the purpose of carrying out other logic operations a greater or a lesser number of levels may be employed. In addition to the carry, augend, and addend inputs C, A, and B, the circuit of FIGURE 1 also receives the complementary inputs C′, A′, and B′, as indicated above. The output circuit 82 produces the output carry OC for the binary adder; the output circuit 84, the sum output S; the output circuit 86, the complementary sum output S′; and the output circuit 88, the complementary output carry OC′.

Quiescently, in the absence of input pulses, the positive voltage supplied by the battery 70 biases in the back direction the diodes at each of the pyramid levels and at the outputs as well as the base-emitter junctions of the output transistors 90.

In operation, an input pulse is supplied to the input terminals of one stage at each level, and only to one stage due to the complementary signal relationship of the inputs at each level. By way of illustration of one operating condition, it is assumed that the input sources 52, 48, 44 of the stages 10, 14, 18 each supplies a negative-going pulse 142, and the sources 46, 50, and 54 do not supply pulses.

These input pulses 142 render the transistors 34 of the stages 10, 14, and 18 conductive to energize the primary windings 24 of these stages. The energization of these primary windings 24 of the stages 10, 14, and 18 induces voltages in the secondary windings of these stages 10, 14, and 18. These induced voltages produce current in a single one of the different secondary winding combinations: namely, in the series circuit made up of the secondary winding 26 of the stage 10, the secondary winding 26 of the stage 14, and the secondary winding 26 of the stage 22. All of the other parallel circuits of secondary windings are effectively cut off.

This operation, sometimes called "current steering," may be appreciated by considering the bases of each of the output transistors 90 as being at the same potential initially. The voltages induced in the secondaries 26–32 of the stage 18 are in a direction to forward bias the diodes 110, 112, 114, 118, 126, 128, 134 and to place the upper terminals of these secondaries above the level of the bases of the associated output transistors 90. Joined to these upper terminals of the stage 18 are the upper terminals of the secondaries 26–32, respectively, of the other third-level stage 20. Therefore, these upper terminals in the stage 20 are at a higher potential than the bases of the associated output transistors 90, and the associated diodes 122, 124, 130, 132, 136, 138, 140 are all biased in the back or cut-off direction.

In a similar fashion, the upper terminals of the secondaries 26 and 28 of the stage 14 are at a higher potential than their lower terminals due to the voltages induced in those secondaries. Correspondingly, therefore, the cathodes of the diodes 58 and 62 (joined through diodes 56 and 60 to the secondaries of stage 14) are at a higher potential than their anodes due to the absence of such induced voltages in the secondaries 26 and 28 of the other second-level stage 16. Thus the diodes 58 and 62 are effectively biased in the back direction. Similarly, the diode 66 of the first level is biased in the back direction due to the voltage induced in the secondary 26 of the stage 10, and due to the fact that the secondaries 26 of the stages 10 and 12 start at their lower terminals effectively at substantially the same potential. Accordingly, the single series combination of secondaries made up of the first secondaries 26, 26, 26 of the stages 10, 14, and 18 is the only one to conduct. Current does not flow in any of the other series combinations of secondaries, because at least one of the diodes in each such combination is biased in the back direction.

Current flows by way of the emitter-base path of the transistor 90 in the output stage 82, the diode 110, and the aforementioned first secondaries 26 of the stages 10, 14, and 18, and via the diode 64 to the current limiter circuit 68. Likewise, there is forward current from the emitter-base path of the transistor 90 in the output circuit 84 through the diode 118 and the series combination of secondaries 26 in the stages 10, 14 and 18. Thus, transistors 90 in the output circuits 82 and 84 both conduct to produce positive-going pulses 144 at their collectors and to supply collector-emitter current to the loads 102 and 104. These pulses 144 to the load circuits 102 and 104 correspond to an output carry OC and a sum S signal, which results are consistent with the assumed input conditions of pulses being supplied to the augend, addend, and previous-carry inputs. That is, the output carry and sum output are binary 1 for the input conditions of addend, augend, and previous-carry all being binary 1. The complement outputs OC′ and S′ are, of course, binary 0 under these conditions.

There are a total of eight different possible input conditions for the three-input binary adder of FIGURE 1. Corresponding to each of these eight combinations of inputs is a different series combination of transformer secondaries. The diode connections to the output circuits 82 to 88 determine that one carry output OC or OC′ and one sum output S or S′ are produced.

The values of the batteries 70 and 76 and resistor 74 of the current limiter 68 are chosen to supply quiescently a small current through the series circuit of that limiter 68. This small quiescent current in the limiter 68 corresponds approximately to the current needed to drive the output transistors 90. When voltages are induced in the transformer secondaries in each level, the current limiter 68 acts as a low impedance for currents in the secondaries up to the aforementioned quiescent current of the limiter 68. For secondary currents in excess of this quiescent current, the limiter diode 72 is cut off and the resistor 74 affords a substantial impedance to limit the value of the output current. This prevents injury to the output transistors 90.

The circuit of FIGURE 1 may be used with more or less than the three levels shown. Due to forward voltage drops of the diode junctions in the secondary circuits, there may be a limit to the number of usable gating levels. That is, it is necessary to back bias and hold non-conducting a secondary path having only $N-1$ excited secondaries. To do this, the E.M.F. induced in those $N-1$ secondaries must be exceeded by the net voltage of the one secondary path that conducts due to N excited secondaries (the conduction resulting in losses due to the conducting diodes). The voltage excess must be sufficient to turn on the output transistors 90.

If the leading or trailing edges of the input pulses 142 do not coincide so that less than all three levels are being driven, the impedances of the secondaries in the transformers 22 of the undriven stages are very high and prevent induced current flow of a magnitude sufficient to drive the output transistors 90. The high impedances of the undriven transformer secondaries are reflections of the high impedances of the cut off transistors 34. Contrariwise, the transformer secondaries present a very low reflected impedance when driven by the low-impedance conducting transistors 34. As a result of this discrimination, a clock is not needed to operate the circuit.

The signal-to-noise ratio of the circuit of FIGURE 1 during operation of each level is extremely high due to the very low impedances of the diodes when forward biased and the very high impedances when back biased; the impedance of the back-biased diode is higher than the impedances of the transformer secondaries having open-circuited primaries. The individual elements of this circuit operate with very little noise, and the interconnections are such that non-operating portions of the circuit are effectively disconnected. These features result in good signal-to-noise ratios, that is, in good current discrimination.

This circuit operates as a current-discriminating circuit; but a measure of voltage discrimination is used to improve this current discrimination. In the current limiter circuit 68, the positive voltage supplied by the battery 70 to the anode of the diode 72 insures that the diodes at each of the pyramid levels is back biased under quiescent conditions so that each of the output transistors 90 is cut off at that time. In principle, the voltage of the battery 70 is not needed, and the anode of the diode 72 may be returned to ground. Thus, quiescently, zero voltage would exist across each of the aforementioned diodes and base-emitter junctions of the output transistors 90. This zero quiescent voltage would result in zero forward current. However, during an input-pulse time period, the input pulses may not exactly coincide, so that less than all three levels are driven. The back bias of the battery 70 is effective in such a situation to neutralize induced voltages occurring in less than all three levels. Thus, small currents due to such induced voltages are substantially prevented. Consequently, the current discrimination of this circuit, which is the ratio of signal-to-noise current, is substantially improved.

The high impedances of the back-biased diodes isolate the selected secondary path from the capacitances of transformers 22 and connecting lines that are outside of the selected path. Thereby, the effective capacitances in the selected path are essentially only those of the selected transformers. Thus, circuit delays are not affected by the capacitances of the unselected transformers. Furthermore, each portion of the selected path is individually energized by way of its own transformer primary 24. Consequently, the delay of the overall selected path is only the delay of the individual transformer secondaries, and there are no cumulative delays. The transformers 22 do not require large driving currents and are generally fast in operation. These conditions make this circuit suitable for extremely high speed operation with a good signal-to-noise ratio. This circuit has been found suitable for multi-megacycle pulse rates, for example, rates of about 20 megacycles.

The resistors 42 shunting the transformer primaries 24 serve to absorb the current induced in the primaries 25 during recovery of the transformers 22. Their resistances are sufficiently large so as not to load the driving transistors 90.

Due to the voltage induced in the primaries 24 upon recovery of the transformers, the drive voltage for these transformer primaries is necessarily limited to half of the reverse voltage rating of the input transistors 34. Thus, this voltage rating is not exceeded during the recovery of the transformer. The voltage drive of the transformer secondaries is determined by the primary return voltage and the turns ratios of the transformers.

The bases of the transistors 34 are returned to a small positive voltage via the resistors 38. This small voltage adds a very small clean-up current to the input of each transistor. This clean-up current is helpful in driving the transistors 34 back to cut off after termination of the input pulses 142, which have driven them to saturation and produced consequent minority-carrier-storage delays. Similar base circuits are provided for the output transistors 90.

The logic of FIGURE 1 may be analyzed by considering each series combination of secondaries as an "and" gate, and each electrically parallel combination of secondaries on the same pyramid level as a buffer or an "or" gate. This invention may be used for various "and" and "or" logic configurations; and it may be used in such configurations that do not employ complementary signal inputs. The diodes at the different levels of the pyramid are so placed that no sneak paths may exist. Generally these diodes may be effectively placed in all leads connected to a junction or to an output circuit.

The stages 10–20 may be identical, and each include the same number of secondary windings 26–32 even though they are not required. Alternatively, different types of stages may be constructed for the different levels of the pyramid circuit in which they are to be employed. In either case, the stages generally are relatively simple and uniform as basic modules. This affords a simplicity of design and satisfies the requirements of ease and simplicity of circuit maintenance and repair in modern day electronic computers. These modules provide a basic circuit element that may be used repetitively to provide almost any logic configuration and to construct a large scale computer. The circuit of FIGURE 1 is economical in the circuit elements required to construct the logic of a binary adder; that is, the circuit requires relatively few transistors, diodes, and transformers.

Figure 3:
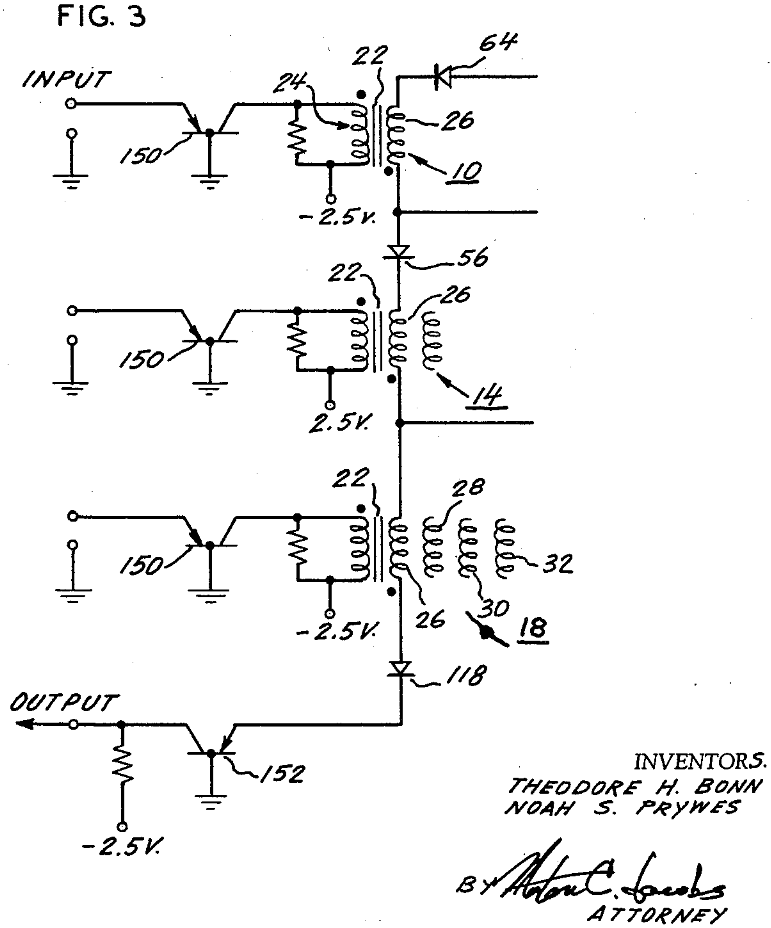
FIGURE 3 is a schematic circuit diagram of a modification of the circuit of FIGURE 1 in which a transistor is connected in the common-base mode.

A modification of the circuit of FIGURE 1 is shown in FIGURE 3. The circuit of FIGURE 3 is a fragment of a binary adder similar to that described above; parts corresponding to those previously described are referenced by the same numerals and operate in a similar manner.

In FIGURE 3, input junction transistors 150 are connected in the common-base mode instead of the common-emitter mode shown in FIGURE 1. The inputs are applied to the emitter-base circuits, and the transformer primaries 24 are driven via the collector-base circuits. Output junction transistors 152 are likewise connected in the common-base mode, with their emitter-base circuits driven by the transformer secondaries. In other respects, the circuits are substantially the same, except that the diodes 56, 64, and 118 are shown reversed due to the reverse direction of current in the arrangement illustrated in FIGURE 3.

With the common-base mode of transistor connection of FIGURE 3, faster circuit operation may be achieved: There is no slow down of circuit operation due to transistor saturation, and the common-base configuration tends to be inherently faster.

In operation, the circuit of FIGURE 3 is similar to the circuit of FIGURE 1. Input signals applied to the emitters of transistors 150 drive the transformers 22. A single path of transformer secondaries made up of a secondary at each level such as the secondaries 26 and the levels 10, 14 and 18 in FIGURE 3, when energized provide a simple conducting path to drive the associate output transistor 152. This operation will be readily apparent from the description above.

Figure 4:
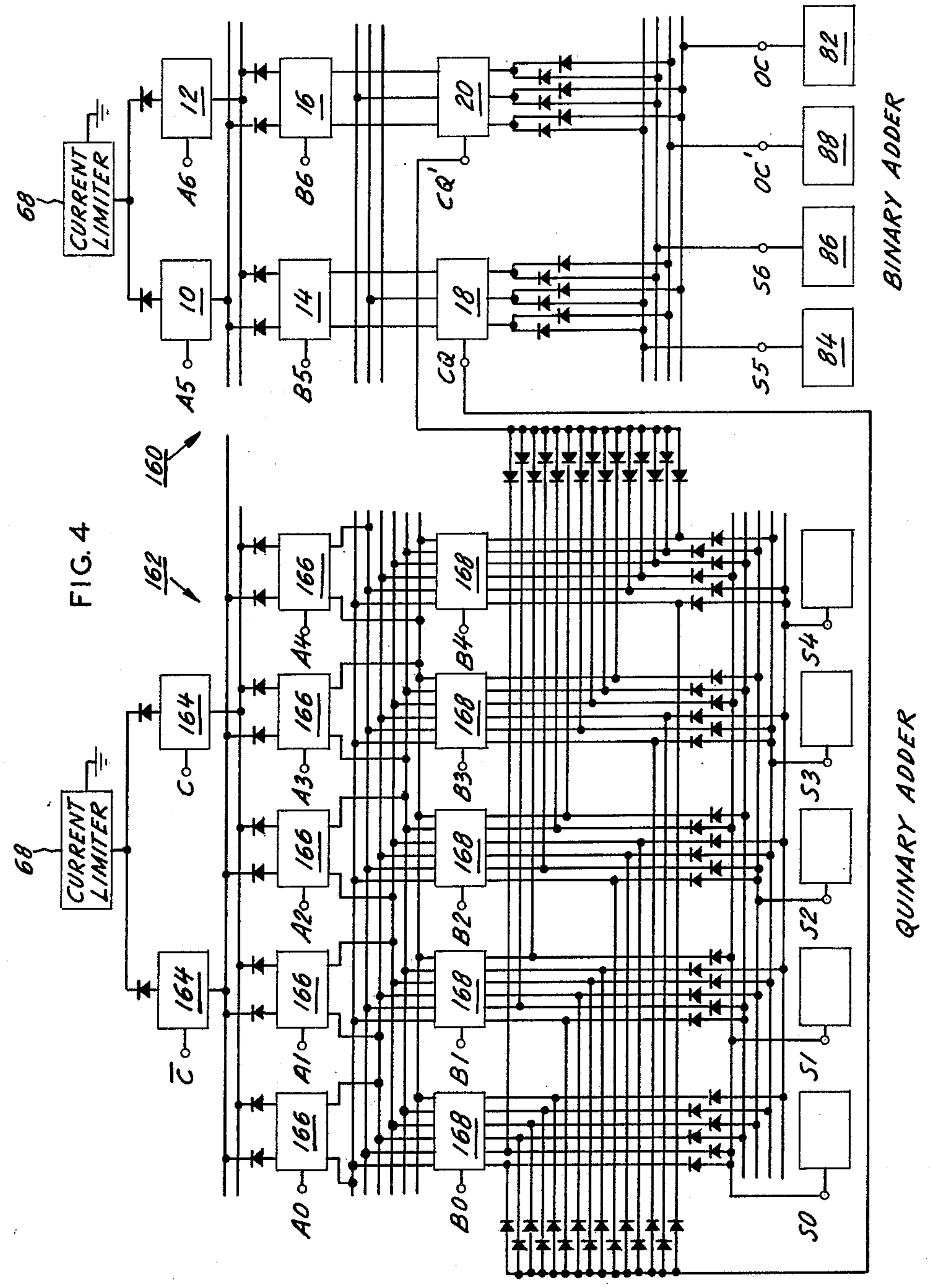
FIGURE 4 is a schematic circuit diagram and partly a block diagram of a computer circuit embodying this invention.

In FIGURE 4 a block circuit diagram of a biquinary adder that may incorporate the circuits of this invention is shown. A biquinary adder is composed of two parts, a binary adder 160 and a quinary adder 162. Biquinary adders are discussed in the book "The Design of Switching Circuits" by Keister et al., Van Nostrand Company, 1951, Section 21.2.

The binary adder 160, on the right side of FIGURE 4, is generally similar to the circuit of FIGURE 1, and corresponding parts are referenced by the same numerals. The quinary adder 162 is similar to the binary adder 160 in that it is made up of three levels with each of the levels being formed of components of the type described above.

In a quinary adder, five bits are involved, and each of the five numbers from 0 to 4 is represented by a pulse in one of the five bit positions and an absence of a pulse in the other four fit positions. The augend inputs to the quinary adder 162 are the five bits A0, A1, A2, A3 and A4, which denote the numbers from 0 to 4. The corresponding augend inputs to the binary adder 160 are two bits, A5, and A6, which respectively indicate whether or not 5 is to be added to the quinary part of the number. In this manner, all the numbers from 0 to 9 are provided for. The addend inputs B are the same as the augend inputs A in this respect. The previous carry input C is fed only to the quinary part 162, and, thus, is added only to the quinary parts of the addend and augend. The addition of the two quinary parts A and B with the previous carry C may result in an internal or quinary carry CQ which is used to augment the sum of the binary part 160 of the adder. The internal or quinary carry CQ and its complement CQ′ are applied as inputs to the third level stages 18 and 20, respectively in the binary adder 160.

In the first level of the quinary adder 162 there are two stages 164, in the second level there are five stages 166 for the augend inputs A, and in the third level there are five stages 168 for the addend inputs B. Each of the stages 164, 166 and 168 may be the same as the stages 18 described above with respect to FIGURE 1, except that the stages 168 require five transformer secondaries for the five contact positions that each stage affords. The contact positions for each stage are indicated by the vertical leads into or out of the stage.

The final addition result appears in the five outputs S0, S1, S2, S3, and S4, which represent the quinary part of the sum, in the outputs S5, and S6, which represent the binary part of the sum, and in the outputs OC and OC′, which represent the output carry. The details of the interconnections of each of the levels and the output circuits will be apparent from the description above in connection with FIGURE 1, from FIGURE 4, and from the discussion of biquinary adders in the above-referenced book.

The system of FIGURE 4 is an example of one pyramid circuit of this invention having its outputs connected to the inputs of another such pyramid.

Figure 5:
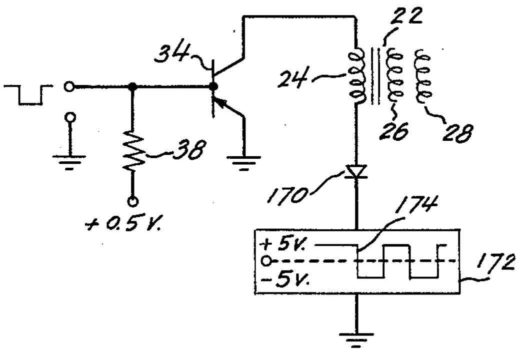
FIGURE 5 is a schematic circuit diagram of another modification of the circuit of FIGURE 1 in which a pulsating power supply is used.

A modification of the circuit of FIGURE 1 is shown in FIGURE 5. The circuit of FIGURE 5 represents a stage of a pyramid circuit similar to stage 18 of FIGURE 1, and parts corresponding to those previously described are referenced by the same numerals. In the circuit of FIGURE 5 the input transistor 34 drives the transformer primary 24 by way of a circuit that includes a diode 170 whose anode is connected to the primary 24, and that also includes a source 172 of alternating voltage pulses 172 connected to the cathode. The voltage pulses 174 vary positively and negatively from ground potential by the rating voltage of the transistor 34, assumed here to be 5 volts.

In operation, during the negative-going portion of a pulse 174, an input pulse may be applied to the transistor 34 to render it conductive to drive the transformer primary 24. A pulse having the full voltage rating of the transistor 34 may be used to drive the transformer primary 24. During transformer recovery, the pulse 174 goes positive to apply a back voltage of 5 volts to the diode 170. This back voltage offsets the voltage induced in the transformer primary 24 during transformer recovery. Accordingly, the back voltage supplied by the positive going portion of the pulse 174 neutralizes the recovery voltage in the transformer primary 24, and the voltage rating of the transistor 34 is not exceeded.

Figure 6:
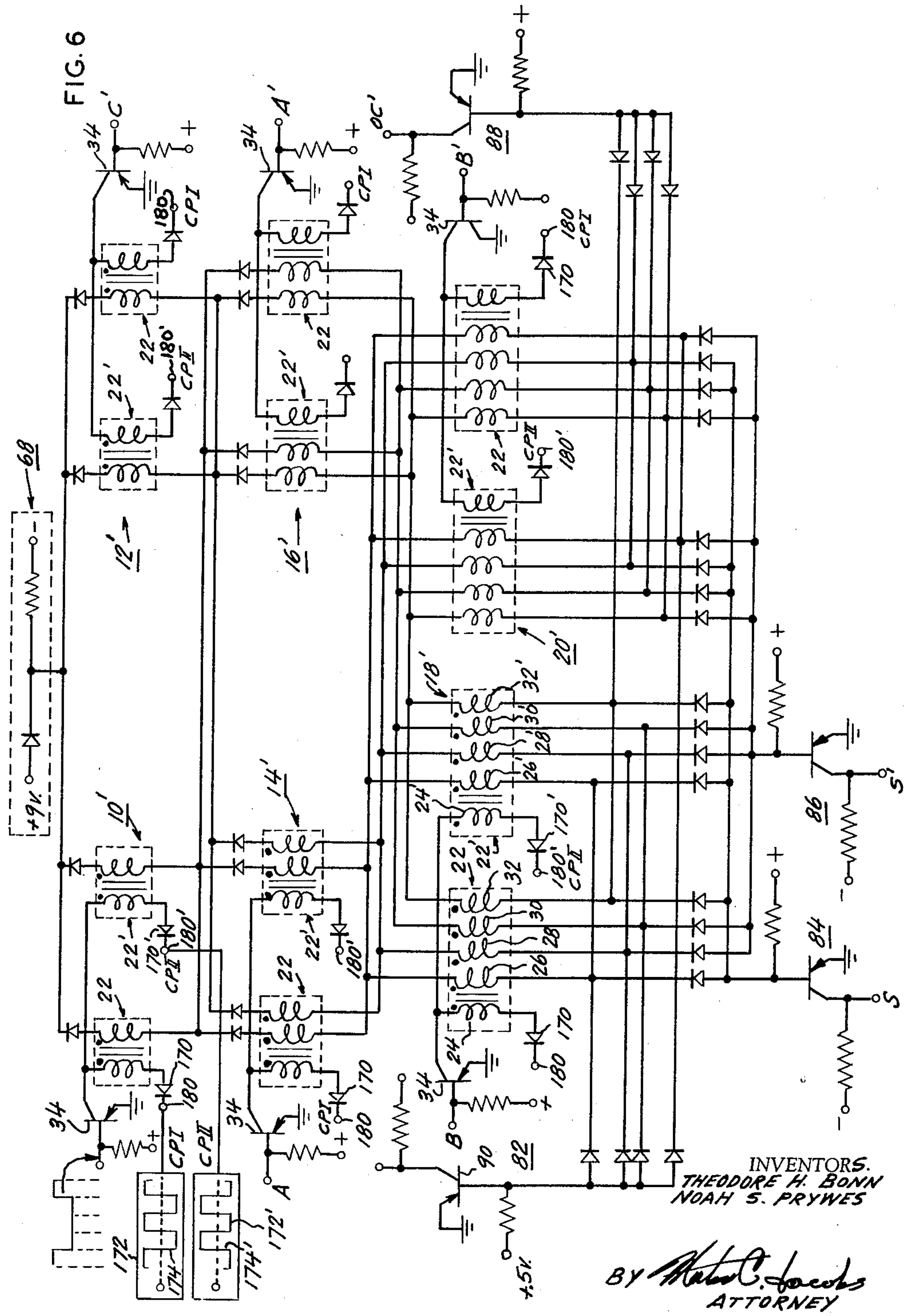
FIGURE 6 is a schematic circuit diagram of another electrical circuit embodying this invention in which a pulsating power supply is used as a clock pulse in a push-pull arrangement.

A binary adder circuit using a clock pulse circuit of the type shown in FIGURE 5 is shown in FIGURE 6. Parts corresponding to those previously described are referenced by the same numerals. The circuit of FIGURE 6 is generally similar to the circuit of FIGURE 1 except that the clock-pulse drive of FIGURE 5 is used in place of the direct-voltage drive circuit of FIGURE 1.

Another difference is that each stage 10′–20′ of the circuit of FIGURE 6 includes two similar transformers 22 and 22′. The stages 10′–20′ are generally similar to the stages 10–20 of FIGURE 1, the addition of the prime in the reference numeral being used to indicate the modifications of a clock-pulse drive and of two transformers 22, 22′ in the stages. Parts of transformers 22′ corresponding to the circuits of the transformers 22 are referenced by the same numerals as those associated with the transformers 22 with the addition of a prime (′).

The source 172 of pulses 174 supplies first clock pulses CP–I to the terminals 180 at the cathodes of the diodes 170 in each of the stages 10′–20′. The source 172′ of pulses 174′ supplies second clock pulses CP–II to the terminals 180′ at the cathodes of diodes 170′ in the circuits of primaries 24′ of the transformers 22′. The pulses 174 are a half-cycle out of phase with the pulses 174′.

In operation, during a first half-cycle, a pulse 174 in the negative-going, or forward direction is applied to the diode 170 at the same time that the positive-going, or back pulse 174′ is applied to the diode 170′ in each of the stages 10′–20′. On the next, or second, half-cycle the opposite pulse directions exist. Thus, during the first and other odd-numbered half-cycles, the transformers 22 in the stages 10′–20′ are energized if the associated transistors 34 receive input pulses and are rendered conductive; and at the same time the transformers 22′ are disabled by the reverse pulses 174′ that are applied to the diodes 170′. On the second and other even-numbered half-cycles, the opposite condition exists: namely, the transformers 22 are disabled and the transformers 22′ are enabled. As a result of this "push-pull" operation, the transformers 22 may be operated while the transformers 22′ are recovering, and vice-versa.

The operation of the binary adder is otherwise the same as that described above. The conducting and non-conducting conditions of the output transistors 90 in the output circuits 82–83 correspond to the logic combinations of conducting and non-conducting conditions of the input transistors 34 at any instant; thus, the outputs correspond to the combinations of inputs A, B, and C being applied at any instant.

The first and second clock-pulses CP–I and CP–II provide the transients needed to operate the transformer circuits. Consequently, it is possible to use a pulse-envelope information pattern for the input signals. In such an information pattern, the signals take the form of levels such as voltage levels rather than the form of pulses and the absence of pulses in a return-to-zero pattern as in FIGURE 1. For example, for the circuitry shown in FIGURE 6, a high voltage input level (to cut off the transistors 34) may correspond to a binary 0 and a low voltage input level (to render the transistors 34 conductive) would correspond to a binary 1. These levels do not change from one clock pulse to the next except as the information changes.

Accordingly, this invention provides new and improved electrical switching and gating circuits that make use of solid state elements. These circuits are of the relay type, and may be operated at high speeds. Logic pyramid circuits may be formed that are composed of simple and uniform basic circuits to provide almost any logic function.

What is claimed is:

1. An electrical circuit comprising a plurality of magnetic elements, input winding means and output winding means linked to each of said elements, each of said elements and its associated winding means being operatively connected in one of a plurality of circuit levels, means for energizing said input winding means in different combinations of a plurality thereof, each of said input combinations including one and only one of said input winding means in each of said levels, separate unidirectional means connecting said output winding means in a plurality of different series circuits, each of said series circuits including a different combination of said output winding means with each of said output combinations corresponding to a different one of said input combinations, each of said unidirectional means being poled and connected to pass in the forward direction signals induced in said output winding means of the associated series circuit upon the energization of said input winding means by said energizing means and to have applied in the back direction said induced signals of another of said series circuits, and separate load means connected in said series circuits.

2. An electrical circuit as recited in claim 1 wherein each of said load means includes means responsive to currents of a certain magnitude in the associated one of said series circuits for producing output signals.

3. An electrical circuit as recited in claim 1 wherein each of said magnetic elements is characterized by substantially no remanence.

4. An electrical circuit as recited in claim 1 and further comprising means connected to said series circuits for limiting the current therein.

5. An electrical circuit comprising a plurality of transformers having input winding means and output winding means, each of said transformers being operatively connected in one of a plurality of circuit levels, means for energizing said input winding means in different combinations, each of said input combinations including one and only one of said input winding means in each of said levels, said energizing means including a separate drive and switching transistor connected to said input windings for presenting low and high impedances dependent upon the operating state of said transistor, respectively, when energizing and not energizing said input winding means whereby low and high impedances are reflected in said output winding means, separate unidirectional means connecting said output winding means in a plurality of different series circuits, each of said series circuits including a different combination of said output winding means with each of said output combinations corresponding to a different one of said input combinations, said unidirectional means being poled and connected to pass in the forward direction signals induced in said output winding means of the associated series circuit upon the energization of said input winding means by said energizing means and to have applied in the back direction said induced signals of another of said series circuits, and separate load means connected in said series circuits.

6. An electrical circuit as recited in claim 5 wherein means are provided for selectively applying input signals to said transistors at certain times.

7. An electrical circuit as recited in claim 6 and further comprising means for applying pulses to said input winding means at times other than said certain times of said input signals, which pulses are of magnitude and direction tending to neutralize pulses induced in said transformers upon recovery thereof.

8. An electrical circuit as recited in claim 6 wherein the collector-emitter path of each of said transistors is connected to the associated one of said input winding means, and said input signal applying means is connected to the base electrode thereof.

9. An electrical circuit as recited in claim 6 wherein the collector-base path of each of said transistors is connected to the associated one of said input winding means, and said input signal applying means is connected to the emitter electrode thereof.

10. An electrical circuit as recited in claim 6 wherein said load means includes a separate transistor connected in each of said series circuits.

11. An electrical circuit comprising a plurality of magnetic elements, input winding means and output winding means linked to each of said elements, each of said elements and its associated winding means being operatively connected in one of a plurality of circuit levels and within each of said levels in one of a plurality of circuit groups, said elements in one or more of said levels having a plurality of said output winding means linked thereto, means for energizing said input winding means in different combinations, each of said input combinations including one and only one of said input winding means in each of said levels, separate unidirectional means connecting said output winding means in a plurality of different series circuits, each of said series circuits including a different combination of said output winding means with each of said output combinations corresponding to a different one of said input combinations each of said output winding means in one level being connected to a plurality of said output winding means in the next level, said unidirectional means being poled to pass in the forward direction signals induced in said output winding means of the associated series circuit upon tthe energization of said input winding means by said energizing means and to block induced signals of other series circuits connected thereto, and separate load means connected in said series circuits.

12. An electrical circuit comprising a plurality of magnetic elements, input winding means and output winding means linked to each of said elements, each of said elements and its associated windings being operatively connected in one of a plurality of circuit levels and within each of said levels in one of a plurality of circuit groups, said elements in one or more said levels having a plurality of said output winding means linked thereto, means for energizing said input winding means in different combinations, each of said input combinations including one and only one of said input winding means in each of said levels, a plurality of unidirectional means connecting said output winding means in a plurality of different series circuits, each of said series circuits including a different combination of said output winding means with each of said output combinations corresponding to a different one of said input combinations, said unidirectional means being poled and connected to pass in the forward direction signals induced in said output winding means of the associated series circuit upon the energization of said input winding means by said energizing means and to have applied in the back direction said induced signals of another of said series circuits, and separate means connected to each of said series circuits and responsive to the currents therein for producing output signals.

13. An electrical circuit as recited in claim 12 and further comprising means connected to said series circuits for limiting the currents therein.

14. An electrical circuit as recited in claim 12 and further comprising means connected to said series circuits for limiting the currents therein and for applying a back bias voltage to said unidirectional means.

15. An electrical circuit comprising a plurality of pyramid circuits; each of said pyramid circuits including a plurality of magnetic elements, input winding means and output winding means linked to each of said elements, each of said elements and its associated windings being operatively connected in one of a plurality of circuit levels and within each level in one of a plurality of circuit groups, said elements in one or more of said levels having a plurality of said output winding means linked thereto, a plurality of means for energizing said input winding means in different combinations, each of said input combinations including one and only one of said input winding means in each of said levels, and a plurality of unidirectional means connecting said output winding means in a plurality of different series circuits, each of said series circuits including a different combination of said output winding means with each of said output combinations corresponding to a different one of said input combinations, said unidirectional means being poled to pass in the forward direction signals induced in said output winding means of the associated series circuit upon the energization of said input winding means by said energizing means, said unidirectional means for said output winding means in the same circuit level being connected in series opposition; a plurality of said series circuits of a first one of said pyramid circuits being connected to supply said forward direction signals to different ones of said means for energizing said input winding means of a second one of said pyramid circuits; said second pyramid circuit further comprising means for deriving output signals from the series circuits thereof.

16. An electrical circuit comprising a plurality of magnetic elements, separate winding means linked to said elements, means for applying input signals of a certain polarity to input portions of said winding means to induce signals of a certain polarity in output portions of said winding means, said input signal applying means being operative to apply said signals to only one of said winding means at a time, separate unidirectional means connecting said output portions to a common connection, said unidirectional means being poled to pass in their respective forward directions said signals of a certain polarity induced in the associated ones of said output portions, and separate load means connected in circuit with said output portions and said common connection so as to receive said signals passed in said forward direction from the respective one of said output portions.

17. An electrical circuit comprising a plurality of transformers having input and output winding means linked to said elements, means for applying input signals of a certain polarity to said input winding means to induce signals of a certain polarity in said output winding means, said input signal applying means being operative to apply said signals to only one of said input winding means at a time, separate unidirectional means connecting said output winding means to a common connection, said unidirectional means being poled and connected to pass in their respective forward directions said signals of a certain polarity induced in the associated ones of said output winding means and to have applied in their respective back directions said signals induced in the other ones of said output winding means, and separate load means connected in circuit with said output winding means and said common connection.

18. An electrical circuit comprising a plurality of magnetic elements, separate winding means linked to said elements, means for applying input signals of a certain polarity to input portions of said winding means to induce signals of a certain polarity in output portions of said winding means, said input signal applying means being operative to apply said signals to only one of said winding means at a time, separate unidirectional means connecting one of said output portions in different series circuits with others of said output portions, said unidirectional means being poled to pass in their respective forward directions said signals of a certain polarity induced in said output portions of the associated series circuits and to block said certain polarity signals induced in said output portions of at least one other of said elements, and separate load means connected to said series circuits.

19. An electrical circuit comprising a plurality of transformers each having a core with substantially no remanence and a primary and a secondary winding linked thereto, means for applying different combinations of binary input signals to said primary windings, separate unidirectional means connecting one of said secondary windings in different series circuits with others of said secondary windings, said unidirectional means being arranged so that voltages induced in the associated secondary windings in response to said input signals tend to produce forward current therein and to block forward current in another of said unidirectional means, and separate load means each connected in a different one of said series circuits.

20. An electrical circuit comprising a plurality of transformers each having a primary and a secondary winding, means for applying input signals to said primary windings, separate unidirectional means connecting a first one of said secondary windings in different series circuits with second ones of said secondary windings, said unidirectional means being arranged so that voltages induced in one of said second secondary windings in response to said input signals tends to produce forward current in the associated one of said unidirectional means and to block forward current in another of said unidirectional means, and separate load means each connected in a different one of said series circuits, and means for limiting the amplitude of current in said series circuits to a certain value.

21. An electrical circuit comprising a plurality of pyramid circuits; each of said pyramid circuits including a plurality of magnetic elements each having substantially no remanence, an input winding and one or more output windings linked to each of said elements, a separate transistor having a current path connected in circuit with each of said input windings, separate means for applying different input signals to an electrode of each of said transistors to render the transistor respectively conductive and non-conductive, each of said elements and its associated windings being operatively connected in one of a plurality of groups and in one of a plurality of circuit levels, separate unidirectional means connecting said output windings in a plurality of series circuits, said unidirectional means being poled to pass in their forward directions currents induced in said output windings in the associated series circuit in response to the application of said input signals to said transistors and connected to have applied in their back directions said induced currents of another series circuit, each of said series circuits including a plurality of output windings in different circuit levels, a plurality of said series circuit including output windings in different ones of said groups, means for limiting the current in said series circuits and for back biasing said unidirectional means, and separate means for deriving output signals connected to said series circuits; a plurality of said output means of one of said pyramid circuits being connected as said means for supplying input signals of another of said pyramid circuits.

22. An electrical circuit comprising a plurality of magnetic elements each having substantially no remanence, an input winding and one or more output windings linked to each of said elements, a separate transistor having a current path connected in circuit with each of said input windings, said transistor presenting a low or high impedance dependent upon whether it is conductive or non-conductive, means for supplying different input signals to an electrode of each of said transistors to render the transistor respectively conductive and non-conductive, each of said elements and the associated windings being operatively related to one of a plurality of groups and to one of a plurality of circuit levels, unidirectional means connecting said output windings in a plurality of series circuits, each of said series circuits including a plurality of output windings related in different circuit levels, each of at least a plurality of said output windings being connected in a plurality of said series circuits which include output windings in different ones of said groups, means for limiting the current in said series circuits and for back biasing said unidirectional means, and a plurality of output transistors each having a current path connected in series with different ones of said series circuits.

23. A binary adder comprising a plurality of transformers arranged in three levels of a pyramid circuit and each having primary and secondary windings, said transformers in first, second, and third ones of said levels having at least one, at least two, and at least four secondary windings respectively, means for energizing said primary windings of three of said transformers in first, second, and third ones of said levels respectively in accordance with addend, augend, and carry signals, respectively, and for energizing said primary windings of three others of said transformers in said first, second, and third levels respectively in accordance with the complements of said addend, augend, and carry signals, respectively, a plurality of unidirectional means connecting said secondary windings in a plurality of different series circuits each including windings from said three levels and corresponding to a different combination of said addend, augend, and carry signals, each of said secondary windings in said first level being connected to two of said secondary windings in said second level and each of said secondary windings in said second level being connected to two of said secondary windings in said third level, each of said unidirectional means being poled to pass in the forward direction signals induced in said secondary winding of the associated one of said series circuits upon the energization of said primary windings by said energizing means and connected to have applied in the back direction said induced signals of another of said series circuits, and separate output means connected to said series circuits for producing sum and carry signals in accordance with the currents therein.

24. An electrical circuit comprising a plurality of pyramid circuits; each of said pyramid circuits including a plurality of magnetic elements, an input winding and one or more output windings linked to each of said elements, separate switching means having a current path connected in circuit with said input windings, means for supplying different control signals to said switching means to render them respectively conductive and non-conductive, means for alternately applying enabling and disabling signals to said switching means, each of said elements and the associated windings being operatively related in one of a plurality of circuit levels and within each level in one of a plurality of groups, and unidirectional means connecting said output windings in a plurality of series circuits, each of said series circuits including a plurality of output windings related in different circuit levels, each of at least a plurality of said output windings being connected in a plurality of said series circuits which include windings in different ones of said groups; a plurality of load means respectively connected to said series circuits in a first one of said pyramid circuits and, in common, to corresponding ones of said series circuits in second one of said pyramid circuits; said enabling and disabling signals of said first pyramid circuit being applied in opposite phase to the corresponding signals of said second pyramid circuit.

25. An electrical circuit comprising a plurality of transformers each having a primary winding and a secondary winding and at least some of said transformers having a plurality of secondary windings, a plurality of sources of input signals, a plurality of transistor switching means each associated with a different one of said transformers and each receiving said input signals from a different one of said sources for selectively energizing different combinations of said primary windings in accordance with said input signals, said plurality of transistor switching means presenting a high or low impedance dependent upon the operating state of said transistor switching means, unidirectional means connecting said secondary windings in a plurality of different series circuits each including secondaries from a different combination of said transformers, said unidirectional means being directed to pass in the forward direction currents induced by said transistor switching means energizing said primary windings, and separate load means connected to said series circuits to be energized by said induced currents.

26. An electrical circuit comprising a plurality of transformers each having a primary winding and a plurality of secondary windings, each transformer being operatively arranged in a plurality of groups, a plurality of sources of input signals, switching means for selectively energizing different combinations of said primary windings in accordance with said input signals, unidirectional means connecting said secondary windings in a plurality of different series circuits each including secondaries from a different combination of said transformers, said unidirectional means being directed to pass in the forward direction currents induced by said switching means energizing said primary windings, means for limiting the current in said series circuits, and separate load means connected to said series circuits to be energized by said induced currents.

(References on following page)

References Cited in the file of this patent

UNITED STATES PATENTS

| | | |
|---|---|---|
| 2,733,860 | Rajchman | Feb. 7, 1956 |
| 2,733,861 | Rajchman | Feb. 7, 1956 |
| 2,760,088 | Pittman et al. | Aug. 21, 1956 |
| 2,781,504 | Canepa | Feb. 12, 1957 |
| 2,785,236 | Bright | Mar. 12, 1957 |
| 2,798,169 | Eckert | July 2, 1957 |
| 2,809,367 | Stuart-Williams | Oct. 8, 1957 |
| 2,819,018 | Yetter | Jan. 7, 1958 |
| 2,819,019 | Yetter | Jan. 7, 1958 |
| 2,846,671 | Yetter | Aug. 5, 1958 |
| 2,884,545 | Houck | Apr. 28, 1959 |
| 2,898,579 | Moore | Aug. 4, 1959 |

FOREIGN PATENTS

| | | |
|---|---|---|
| 1,120,525 | France | Apr. 23, 1956 |
| 193,638 | Austria | Nov. 25, 1957 |
| 1,158,507 | France | Jan. 27, 1958 |

OTHER REFERENCES

Digital Computer Components and Circuits, by Richards, D. Van Nostrand Company, Princeton, New Jersey (c. 1957). Pages 37–39 and FIG. 2–1(B) relied on.

Design of Switching Circuits, by Keister et al., D. Van Nostrand Company, New York city (c. 1951). Pages 462–472 and FIG. 21–2 relied on.